(12) United States Patent
Yeh et al.

(10) Patent No.: US 6,294,832 B1
(45) Date of Patent: Sep. 25, 2001

(54) SEMICONDUCTOR DEVICE HAVING STRUCTURE OF COPPER INTERCONNECT/ BARRIER DIELECTRIC LINER/LOW-K DIELECTRIC TRENCH AND ITS FABRICATION METHOD

(75) Inventors: Ching-Fa Yeh; Yueh-Chuan Lee; Kwo-Hau Wu; Yuh-Ching Su, all of Hsinchu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/546,539

(22) Filed: Apr. 10, 2000

(51) Int. Cl.[7] .................. H01L 23/48; H01L 21/4763
(52) U.S. Cl. ............ 257/751; 257/758; 257/760; 257/762; 438/624; 438/639; 438/687; 438/777
(58) Field of Search ................... 257/751, 758, 257/759, 760, 762; 438/622, 623, 624, 639, 687, 775, 776, 777, 782

(56) References Cited

U.S. PATENT DOCUMENTS

| | | | |
|---|---|---|---|
| 5,521,424 | * | 5/1996 | Ueno et al. ............ 257/632 |
| 5,766,692 | * | 6/1998 | Lee et al. ............ 427/443.2 |
| 5,869,149 | * | 2/1999 | Denison et al. ............ 427/579 |
| 6,008,118 | * | 12/1999 | Yeh et al. ............ 438/629 |
| 6,166,427 | * | 12/2000 | Huang et al. ............ 257/635 |
| 6,177,364 | * | 1/2001 | Huang ............ 438/792 |
| 6,187,663 | * | 2/2001 | Yu et al. ............ 438/624 |

FOREIGN PATENT DOCUMENTS

410144792 * 5/1998 (JP) ............ H01L/21/768

OTHER PUBLICATIONS

Zielinski, E.M., et al. "Damascene Integration of Copper and Ultra–Low–k Xerogel for High Performance Interconnects," IEEE IEDM Tech. Digest, Dec. 1997, pp. 936–938.*
Aoki, H, et al., "A Degradation–Free Cu/HSQ Damascene Technology using Metal Patterning and Post–CMP Cleaning by Electrolytic Ionized Water," IEEE IEDM Tech. Digest, Dec. 1997, pp. 777–780.*
Sun, S.C., et al., "A Comparative Study of CVD TiN and a CVD TaN Diffusion Barrier for Copper Interconnection," IEEE IEDM Tech. Digest, Dec. 1995, pp. 461–464.*
Ohshima, T., et al., "Improvement of Thermal Stability of Via Resistance in Dual Damascene Copper Interconnection," IEEE IEDM Tech. Digest, Dec. 2000, pp. 123–126.*
K. Mikagi, et al., "Barrier Metal Free Copper Damascene Interconnection Technology Using Atmospheric Coppper Reflow and Nitrogen Doping in SiOF Film", IEEE, IEDM, 1996, pp. 365–368.

* cited by examiner

Primary Examiner—T. N. Quach
(74) Attorney, Agent, or Firm—Lowe Hauptman Gilman & Berner, LLP (57) ABSTRACT

The present invention is related to a interconnection structure with Cu interconnects and low-k dielectric, in which a barrier dielectric liner made of a nitrogen-containing liquid-phase-deposition (LPD) fluorosilicate glass (FSG) film is used to replace a barrier metal layer and an oxide liner.

23 Claims, 7 Drawing Sheets

SEMICONDUCTOR DEVICE HAVING STRUCTURE OF COPPER INTERCONNECT/BARRIER DIELECTRIC LINER/LOW-K DIELECTRIC TRENCH AND ITS FABRICATION METHOD

FIELD OF THE INVENTION

The present invention is related to the interconnection structure with Cu interconnects and low-k dielectric, and in particular to a semiconductor device having a structure of Cu interconnect/barrier dielectric liner/low-k dielectric trench. The present invention is also related to a method for capping low-k dielectric trenches to reduce the leakage current between separate Cu interconnects, and to prevent Cu from penetration into the low-k dielectric.

BACKGROUND OF THE INVENTION

Figure 1:
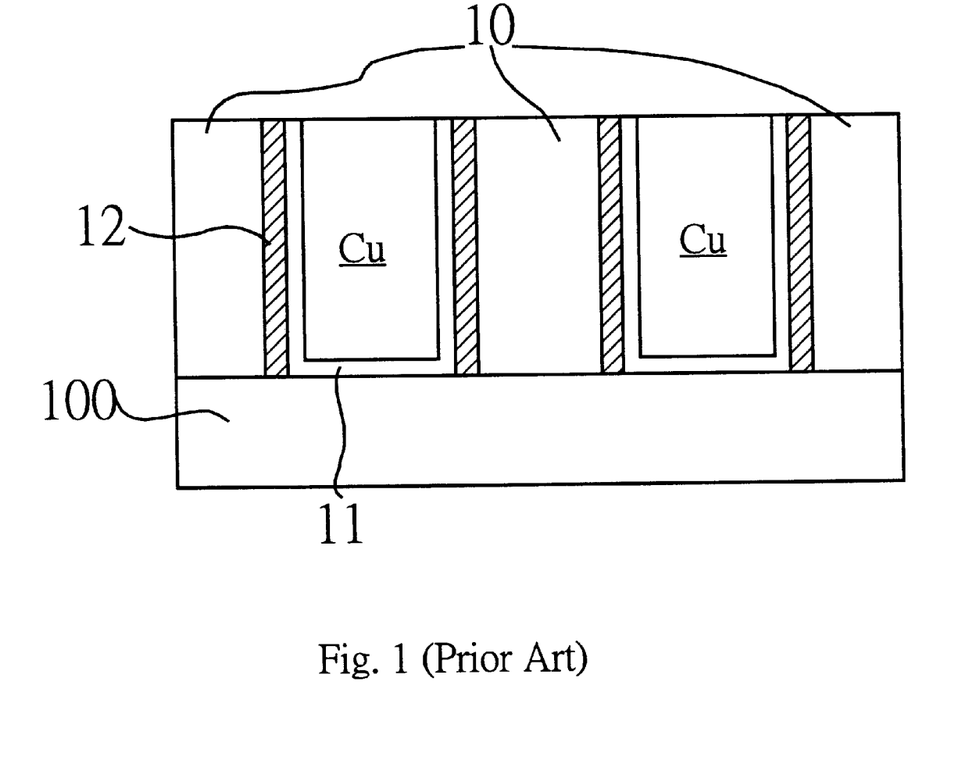
FIG. 1 is a cross-sectional schematic diagram of Cu/low-k dielectric integrated damascene structure based on the prior art.

FIG. 1 illustrates a prior art integrated damascene structure with Cu interconnect, low-k dielectric 10, barrier metal layer 11, and oxide liner 12 formed on an insulator layer 100. The barrier metal 11, and oxide liner 12 composition of TiN, WN, or TaN, serves the purpose of preventing Cu atoms and/or ions from penetration into the low-k dielectric 10. [E. M. Zielinski, S. W. Russell, R. S. List, A. M. Wilson, C. Jin, K. J. Newton, J. P. Lu, T. Hurd, W. Y. Hsu, V. Cordasco, M. Gopikanth, V. Korthuis, W. Lee, G. Cemy, N. M. Russel, P. B. Smith, S. O'Brien, and R. H. Havemann, in Tech. Dig. IEEE Int. Electron Devices Meeting (IEDM), 936 (1997); H. Aoki, S. Yamasaki, T. Usami, Y. Tsuchiya, N. Ito, T. Onodera, Y. Hayashi, K. Ueno, H. Gomi, and N. Aoto, in Tech. Dig. IEEE Int. Electron Devices Meeting (IEDM), 777(1997); S. C. Sun, in Tech. Dig. IEEE Int. Electron Devices Meeting. (IEDM), 765 (1997); S. C. Sun, M. H. Tsai, H. T. Chiu, S. H. Chuang, and C. E. Tsai, in Tech. Dig. IEEE Int. Electron Devices Meeting. (IEDM), 61 (1995); J. P. Lu, W. Y. Hsu, J. D. Luttmer, L. K. Magel, and H. L. Tsai, J. Electrochem. Soc., 145, L21 (1998); J. P. Lu, W. Y. Hsu, G. A. Dixit, J. D. Luttmer, R. H. Havemann, and L. K. Magel,, J. Electrochem. Soc., 143, L279 (1996); Y. Huang, T. R. Yew, W. Lur, and S. W. Sun, Proc. of 15th VLSI Multilevel Interconnection Conference (VMIC), 33 (1998);] Besides, the oxide liner 12 deposited on trench sidewalls can effectively reduce the leakage current through the low-k dielectric under bias.

The resistivity of barrier metal is generally two to three orders of magnitude higher than that of copper. The barrier metal in the interconnection is obviously not beneficial to lowering the interconnect resistance. Therefore, a thin qualified barrier dielectric liner should be developed to replace both the barrier metal and the oxide liner. In other words, a damascene interconnection in a barrier-metal-free scheme by using the barrier dielectric liner can effectively minimizing the resistance-capacitance time delay [K. Mikagi, H. Ishikawa, T. Usami, M. Suzuki, K. Inoue, N. Oda, S. Chikaki, I. Sakai, and T. Kikkawa, in Tech. Dig IEEE Int. Electron Devices Meeting (IEDM), 365 (1996)], the leakage current and the process complexity.

SUMMARY OF THE INVENTION

The present invention provides a novel technology of barrier dielectric liner, which is prepared by liquid-phase deposition (LPD) and subsequent $NH_3$-plasma annealing. The liner is to be applied on damascene interconnection of Cu/low-k dielectric.

A semiconductor device having a structure of Cu interconnect/barrier dielectric liner/low-k dielectric trench fabricated according to the invention, which includes:

a) a substrate;

b) a low-k (k<3) dielectric layer on said substrate, wherein said dielectric layer has a plurality of trenches;

c) a barrier dielectric liner on each sidewall of each trench, wherein said barrier dielectric liner is a nitrogen-containing liquid-phase-deposition (LPD) fluorosilicate glass (FSG) film; and d) Cu interconnects inlayed in said trenches; wherein said low-k dielectric layer and said Cu interconnects are separated with said barrier dielectric liner, whose thin surface layer adjacent to said Cu interconnects has a nitrogen concentration within 3–50 atom % and a fluorine concentration within 0.5–10 atom %.

A suitable method for forming a structure of barrier dielectric liner/low-k dielectric trench of the present invention includes the following steps:

A) preparing a silica-supersaturated hydrofluosilicic acid ($H_2SiF_6$) solution;

B) immersing a semiconductor substrate having a plurality of low-k dielectric trenches into the silica-supersaturated $H_2SiF_6$ solution prepared in step A), so that a whole surface of said plurality of low-k dielectric trenches is capped with a FSG film, wherein a space between vis-à-vis FSG-capped sidewalls of each trench is preserved for formation of a Cu interconnect;

C) removing the FSG film not on the vis-à-vis sidewalls of each trench by using anisotropic etching; and D) nitridation of the remaining FSG film on the vis-à-vis sidewalls of each trench from step C) by using $NH_3$-plasma annealing for enhancing the barrier property of FSG film to Cu penetration.

Preferably, the method of the present invention further comprises E) forming a Cu interconnect in said space between the vis-à-vis FSG-capped sidewalls of each trench after step D).

Low-k dielectrics applicable to the present invention are methyl silsesquioxane (MSQ), hydrogen silsesquioxane (HSQ) and other similar materials, wherein MSQ is preferable.

For the semiconductor device of the present invention, preferably the bulk part of barrier dielectric liner, i.e. the part outside the thin surface layer, has a fluorine concentration within 6–10 atom %.

For the barrier dielectric liner used in the semiconductor device of the present invention, preferably the depth of its thin surface layer is within 3–30 nm.

Preferably, the nitrogen containing LPD FSG film of the present invention is prepared first by immersing a substrate having a plurality of low-k dielectric trenches into a silica-supersaturated $H_2SiF_6$ solution to form a fluorosilicate glass film, and then by annealing the fluorosilicate glass film in $NH_3$-plasma ambient. A suitable method for preparing the silica-supersaturated $H_2SiF_6$ solution includes elevating a temperature of a silica-saturated $H_2SiF_6$ solution for 10° C. or above. Preferably, the temperature of the silica-saturated $H_2SiF_6$. solution is about 0° C., and the elevated temperature of the silica-supersaturated $H_2SiF_6$ solution is about 25° C. A suitable method for preparing the silica-saturated $H_2SiF_6$ solution includes adding a sufficient amount of silica powder into a $H_2SiF_6$ solution having a concentration between 0.5–4.0 M, stirring the resulting mixture at 0° C. for a period of time, and then filtering the mixture for removal of undissolved silica powder.

Preferably, the $NH_3$-plasma annealing of the present invention is conducted in a plasma-enhanced chemical vapor deposition reactor under the following conditions: chuck temperature within 25–400° C., chamber pressure within 10–800 mTorr, RF power within 100–1000 W and $NH_3$ gas flow rate within 100–2000 sccm, and annealing time within 30–7200 sec.

The FSG film formed in step B) of the present invention preferably has a dielectric constant (k) lower than 3.9. More preferably, it has a k value lower than 3.5.

The FSG film formed in step B) of the present invention preferably has a fluorine concentration within 6–10 atom %.

The $NH_3$-plasma annealing used in step D) of the present invention preferably forms a thin nitrogen-containing layer on the surface of FSG film, wherein the thin nitrogen-containing layer has a nitrogen concentration within 3–50 atom %, and a fluorine concentration within 0.5–10 atom %. More preferably, the depth of the thin nitrogen-containing layer is within 3–30 nm.

DETAILED DESCRIPTION OF THE PREFERRED EMBODIMENTS OF THE INVENTION

The present invention provides a method of forming a barrier dielectric liner for Cu/low-k dielectric interconnection, wherein the liner is prepared by depositing a LPD FSG film on sidewalls of low-k dielectric trenches and then by annealing the trenches capped with FSG film in $NH_3$-plasma ambient. A barrier dielectric liner should meet the following essential requirements, which are (1) thin and conformal deposition, (2) effective barrier property to prevent Cu penetration, and (3) sufficient low leakage current level. Since the LPD FSG film with subsequent $NH_3$-plasma annealing of the present invention is a qualified barrier dielectric liner, it can serve both purposes of being a barrier layer as well as an oxide liner, and could simultaneously replace both the barrier metal 11 and the oxide liner 12 illustrated in FIG. 1.

In the following, the advantages and the workability of the present invention will be verified by demonstrating that the barrier dielectric liner, which was prepared by LPD and $NH_3$-plasma annealing, meets the above essential requirements. The barrier dielectric liner was capped on MSQ trenches or film, wherein MSQ was employed as an example of the inter-Cu-metal low-k dielectric. To prepare LPD FSG film, 80 g silica powder was first dissolved into 1500 ml of 4 M $H_2SiF_6$ solution at 0° C., and the resulting mixture was stirred for 24 hrs and filtered to obtain a silica-saturated $H_2SiF_6$ solution. As the silica-saturated $H_2SiF_6$ solution was heated to 25 ° C., supersaturation of silica occurred. The supersaturation of silica is caused by low solubility of silica in $H_2SiF_6$ solution at high temperature. [Y. Sakai, T. Goda, A. Hishinuma, and H. Kawahara: Proceeding of the International Ceramics Conference (AUSTCERAM 90) (1990) 474] At this point, the wafers were immersed into the silica-supersaturated solution, and a LPD FSG film was gradually deposited onto the wafers. The deposition rate at 25° C. is about 20 nm/hr.

Figure 2A:
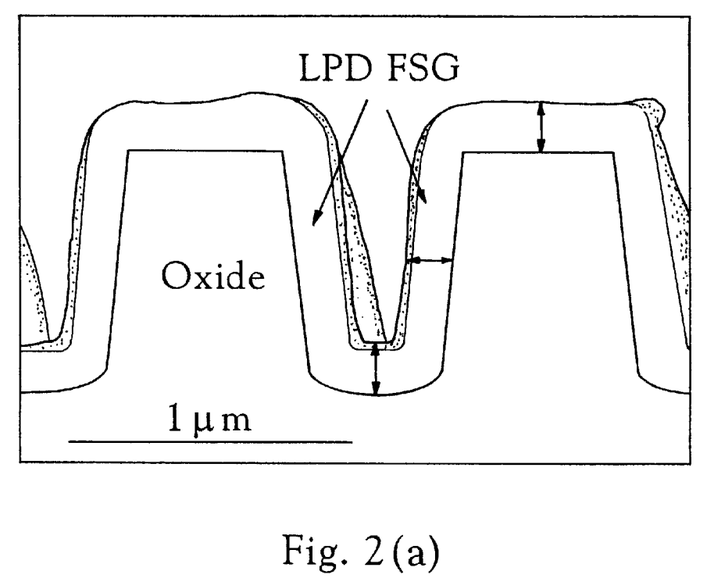
FIG. 2(a) is a SEM cross-sectional picture of 200 nm-thick LPD FSG film deposited on 0.6 μm-wide trenches of PECVD TEOS oxide.
Figure 2B:
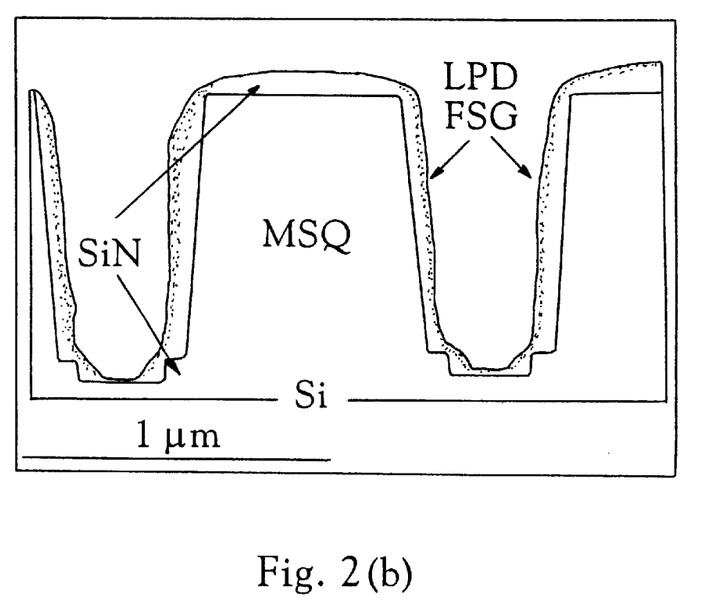
FIG. 2(b) is a SEM cross-sectional picture of 54 nm-thick LPD FSG film deposited on 0.48 μm-wide trenches of low-k MSQ.

To verify that LPD technology meets the requirement of conformal deposition, the FSG film was deposited on PECVD TEOS $SiO_2$ oxide or MSQ trenches and their cross-sectional views were investigated using scanning electron microscope (SEM). The step coverage is calculated to evaluate the degree of conformal deposition, which is defined as the ratio of thickness on the trench bottom to that on the trench top. As shown in FIG. 2(a), oxide trenches of 0.6 μm wide capped with 200 nm-thick LPD FSG film producing an aspect ratio of 4.4 without overhang reveals an excellent step coverage of 95%. The step coverage of LPD FSG film is obviously superior to those of recognized conformal barrier metals, such as 40–70% for PECVD WNx and 20–80% for CVD TiN. FIG. 2(b) depicts the SEM cross-sectional view of a thin conformal LPD FSG film (57 nm thick) on the sidewalls of 0.48 μm-wide MSO trenches with an aspect ratio of 2.

In one of the preferred embodiments of the present invention, the LPD FSG film on a Si substrate was annealed in a conventional PECVD reactor with parallel-plate electrodes under the following conditions.

Process temperature: 300° C.

Aux. temperature: 250° C.

Pressure: 300 mTorr

RF power: 200 W $NH_3$ gas flow rate: 700 sccm

Annealing time: 30 min

LPD FSG films with/without $NH_3$-plasma annealing were analyzed by X-ray photoelectron spectroscopy (XPS) and secondary ion mass spectroscopy (SIMS) to investigate the change in chemical composition of the film after the annealing, wherein LPD FSG film without $NH_3$-plasma annealing was a comparison sample.

Figure 3A:
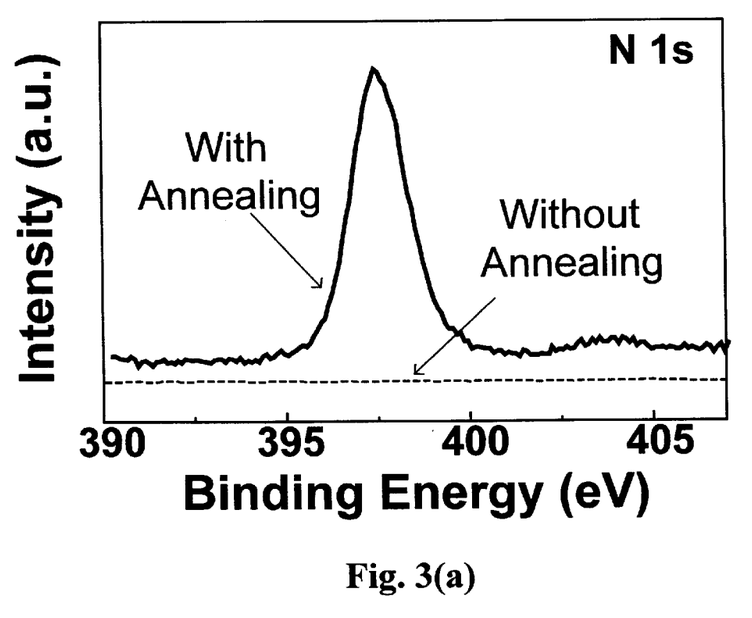
FIG. 3(a) shows XPS spectra of N 1s for LPD FSG films with/without $NH_3$-plasma annealing.
Figure 3B:
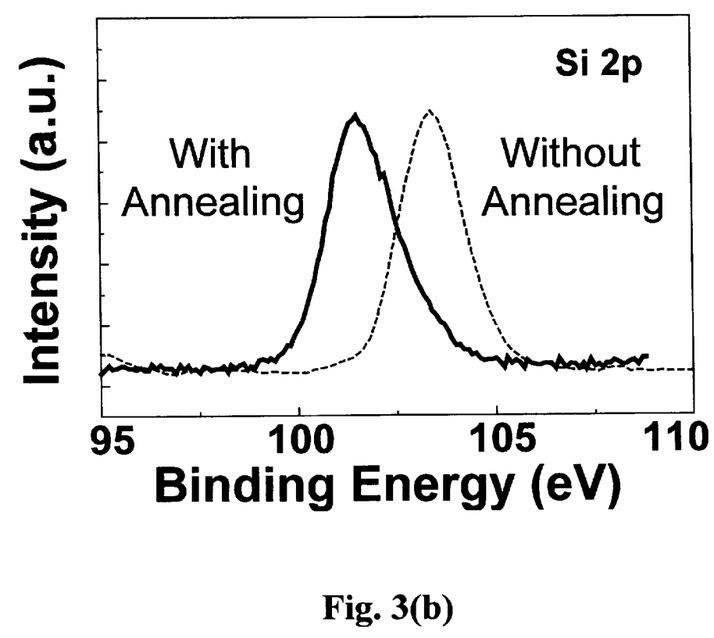
FIG. 3(b) shows XPS spectra of Si 2p for LPD FSG films with/without $NH_3$-plasma annealing.

FIGS. 3(a) and 3(b) are the XPS spectra of N 1s and Si 2p, respectively. As shown in FIG. 3(a), for LPD FSG film with $NH_3$-plasma annealing there is an intense peak at 397.2 eV, which is just within N 1s peak position range of 396.97–397.82 eV for SiON film. [ Z. H. Lu, S. P. Tay, R. Cao, and P. Pianetta, Appl. Phys. Lett. 67 (1995) 2836] For LPD FSG film without annealing there is no N 1s peak. As shown in FIG. 3(b), for LPD FSG film with NH$_3$-plasma annealing the Si 2p peak position is 3 eV lower than that for LPD FSG film without annealing. Generally, the lower shift indicates that silicon has a bonding with a less electronegative atom. Because nitrogen is less electronegative than fluorine and oxygen, the lower shift can be attributed to a part of Si—F and Si—O bonds on the film surface have been changed into Si—N bonds during NH$_3$-plasma annealing. This inference is also verified with the concentration summary listed in Table 1, in terms of significantly increased nitrogen concentration (34.2 atom %) and reduced fluorine and oxygen concentrations for LPD FSG film with NH$_3$-plasma annealing. The above XPS analyses reveal that the surface layer of LPD FSG film with NH$_3$-plasma annealing is of SION bonding structure, which possess excellent barrier property to Cu penetration.

TABLE 1

|  | Si | O | F | N |
|---|---|---|---|---|
| With NH$_3$ annealing (atom %) | 41.72 | 21.14 | 2.92 | 34.23 |
| Without NH$_3$ annealing (atom %) | 37.99 | 52.41 | 8.6 | 0 |

Figure 4A:
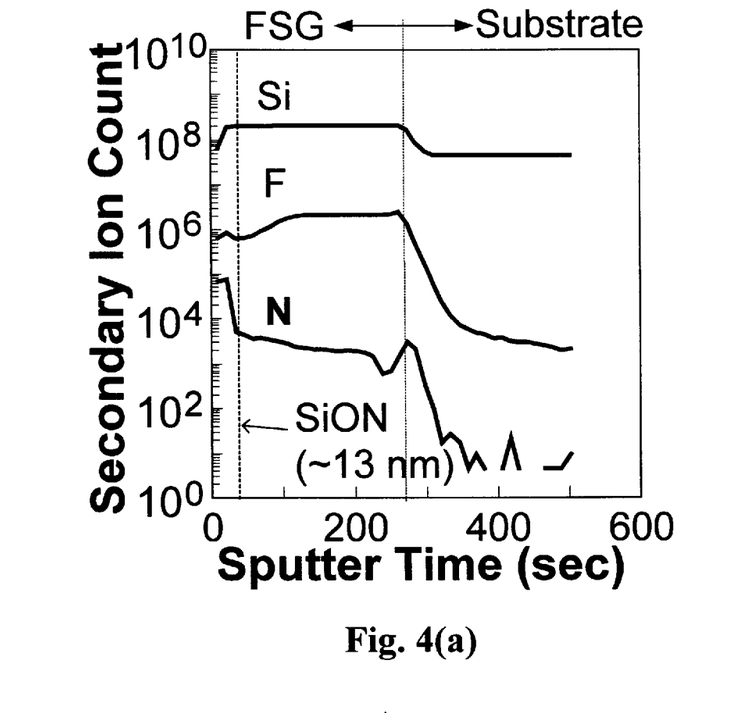
FIG. 4(a) shows SIMS depth profiles of LPD FSG film with $NH_3$-plasma annealing.
Figure 4B:
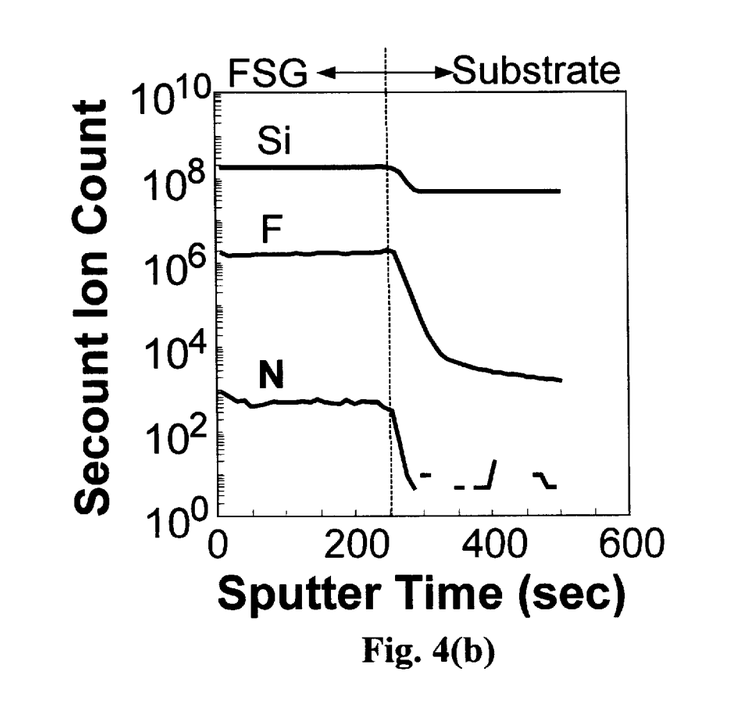
FIG. 4(b) shows SIMS depth profiles of LPD FSG film without $NH_3$-plasma annealing.

FIGS. 4(a) and 4(b) are the SIMS depth profiles for LPD FSG film with NH$_3$-plasma annealing and that without NH$_3$-plasma annealing, respectively. By comparing these two figures, we confirm again that nitrogen atoms have been incorporated into the FSG film with NH$_3$-annealing. In particular, we find a 13 nm-thick nitrogen pileup layer near the surface of the annealed film. In total, a surface SiON layer, which is 13 nm-thick with a high nitrogen concentration of 34 atom %, was formed on the FSG film after the NH$_3$-plasma annealing.

Figure 5A:
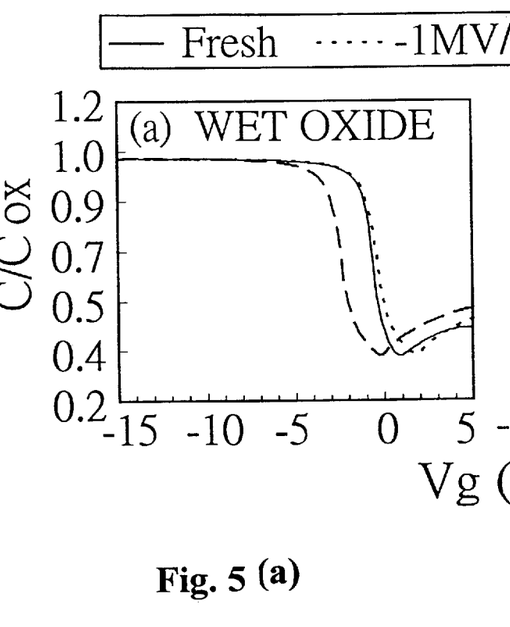
FIG. 5(a) shows high frequency C-V curves of MIS capacitor before and after BTS (±1 MV/cm, 150° C., 30 sec), wherein the insulator of MIS capacitor is the wet oxide film.
Figure 5B:
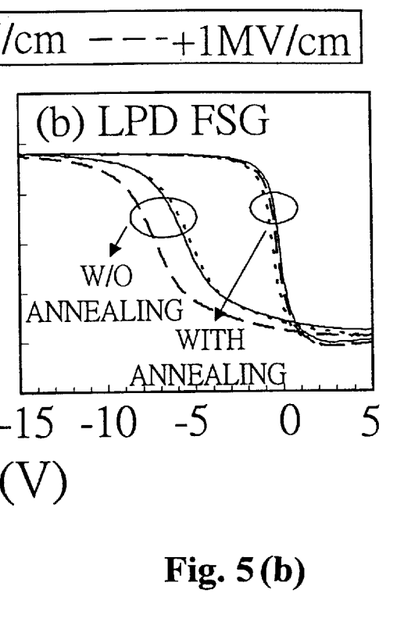
FIG. 5(b) shows high frequency C-V curves of MIS capacitors before and after BTS (±1 MV/cm, 150° C., 30 sec), wherein the insulators of MIS capacitors are LPD FSG films with/without $NH_3$-plasma annealing.

For capacitors of Cu/insulator/20 nm dry oxide/p-Si structure, high frequency (1 MHz) C-V curves before and after bias-temperature stress (BTS) at ±1 MV/cm, 150° C. for 30 sec were monitored to evaluate the Cu blocking ability of the insulator. 140 nm-thick LPD FSG film with NH$_3$-plasma annealing as the insulator was investigated. Also investigated herein were the wet oxide (without dry oxide interface) and the FSG film without plasma annealing for comparison. According to FIG. 5(a), the C-V curve for the wet oxide sample shifts only slightly after negative BTS, i.e. −1 MV/cm at 150° C. for 30 sec, indicating that the mobile ions such as sodium and potassium ions in wet oxide before stress are scant. After additional positive BTS, the C-V curve shifts ~−2V, indicating that Cu ions from Cu gate have penetrated into wet oxide under the positive BTS. Obviously, the BTS condition is sufficient to drive Cu ions from the electrode into the high-density wet oxide. FIG. 5(b) displays the C-V curves before/after BTS for LPD FSG films with/without NH$_3$-plasma annealing. For LPD FSG film without NH$_3$-plasma annealing, the C-V curve also shifts ~−2V after positive BTS, revealing that LPD FSG (without NH$_3$-plasma annealing) can not block Cu penetration. However, for LPD FSG film with NH$_3$-plasma annealing, the C-V curves before/after BTS nearly merge together, indicating that Cu ions can not penetrate through the surface SiON layer into the bulk of the annealed LPD FSG film under positive BTS.

Figure 6:
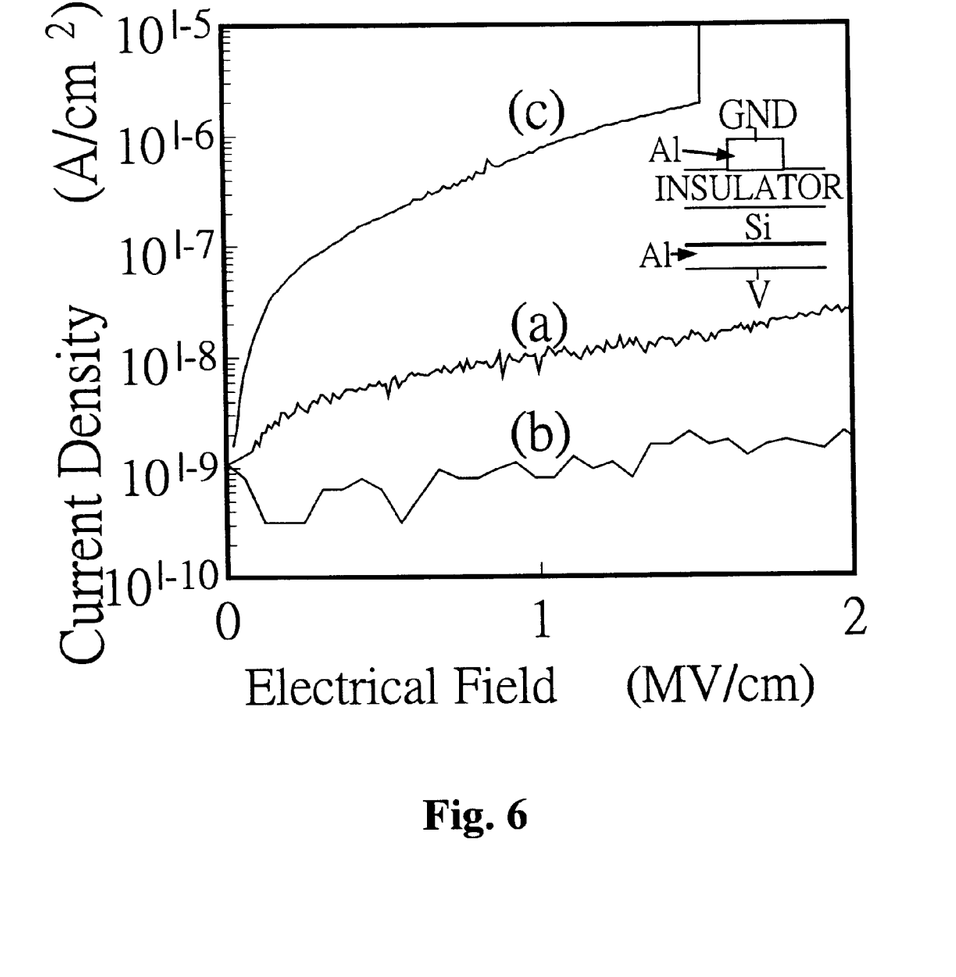
FIG. 6 shows J-E curves of MIS capacitors with (a) 100 nm-thick $NH_3$-plasma annealed LPD FSG/390 nm-thick MSQ stacked films, (b) 100 nm-thick $NH_3$-plasma annealed LPD FSG film, and (c) 390 nm-thick MSQ film being used as the insulator.

To evaluate the insulating property of LPD FSG film, the characteristic of current density versus electrical field (J-E) was investigated. The Al-metal/insulator/semiconductor capacitor (MIS structure), shown in the inset of FIG. 6, was prepared using NH$_3$-plasma annealed LPD FSG (100 nm thick)/MSQ (390 nm thick) stacked films as the insulator. Here the stacked films were used to simulate oxide liner capped on MSQ trenches. For comparison, the MIS capacitors containing MSQ or annealed LPD FSG film separately were also prepared and measured. FIG. 6 illustrates the comparison of three J-E characteristics for (a) NH$_3$-plasma annealed 100 nm-thick LPD FSG/390 nm-thick MSQ stacked films, (b) NH$_3$-plasma annealed 100 nm-thick LPD FSG film, (c) 390 nm-thick MSQ film. As for LPD FSG/MSQ stacked films (a), the current density at 1 MV/cm is 7.14×10$^{-9}$ A/cm$^2$, which is two orders of magnitude lower than that of MSQ film (c). Obviously, LPD FSG film with NH$_3$-plasma annealing as a capping layer on MSQ can substantially reduce the leakage through MSQ. This reduction in leakage current is due to the excellent insulating property of LPD FSG film with NH$_3$-plasma annealing, as indicated by curve (b). In addition to having the merit of leakage current reduction, LPD FSG film with NH$_3$-plasma annealing as a capping layer on MSQ can also improve the breakdown field of MSQ film from 1.5 to 2 MV/cm.

As indicated in FIG. 2, FIG. 5 and FIG. 6, LPD FSG film with NH$_3$-plasma annealing as a capping layer on low-k dielectric qualifies the requirements of conformal deposition, effective blocking of Cu penetration, and excellent insulating property to reduce the leakage current through the low-k dielectric. LPD FSG film with NH$_3$-plasma annealing is thus an effective barrier dielectric liner and can simultaneously replace both the barrier metal and the oxide liner. Compared with conventional interconnection with both the oxide liner and the barrier metal, resistance of interconnection with the barrier dielectric liner only can be easily minimized because of elimination of the high-resistivity barrier metal. For the interconnection with barrier dielectric liner, the minimized resistance contributes to reduction of RC delay. In total, the barrier dielectric liner, which is prepared by LPD and NH$_3$-plasma annealing, has much potential to be widely applied on Cu/low-k dielectric interconnection of ULSI.

Figure 7:
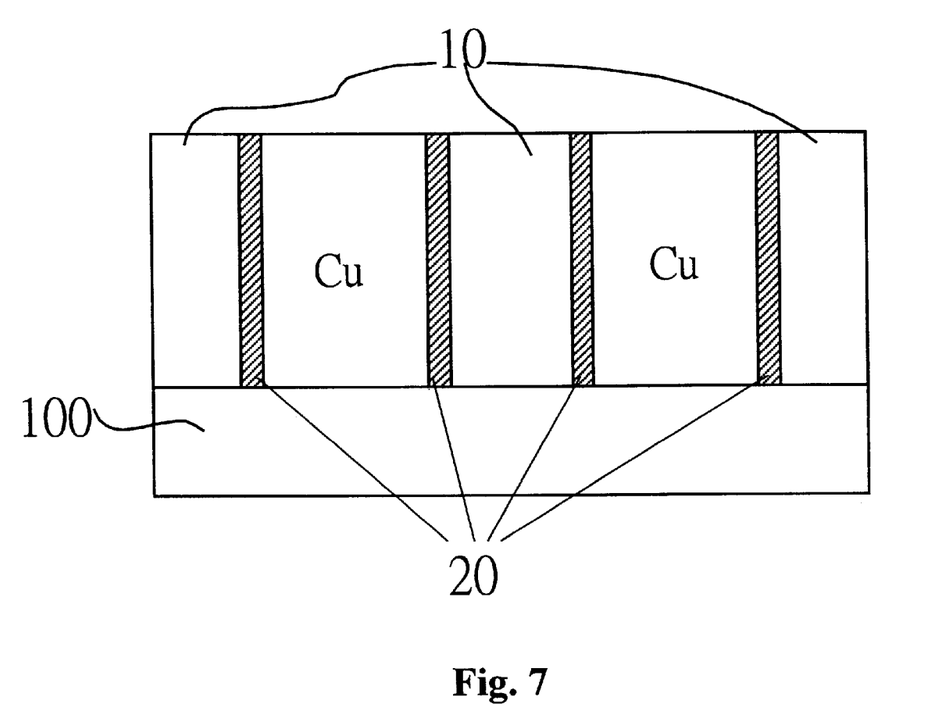
FIG. 7 is a cross-sectional schematic diagram of Cu/low-k dielectric integrated damascene structure based on the present invention.

The above description clearly indicates that a semiconductor device having a structure of Cu interconnect/barrier dielectric liner/low-k dielectric trench fabricated according to the present invention comprises, as shown in FIG. 7:

a) a substrate 100;

b) a low-k (k<3) dielectric layer 10 on said substrate, wherein the dielectric layer has been patterned into a plurality of trenches;

c) a barrier dielectric liner 20 on sidewalls of each trench, wherein the barrier dielectric liner 20 is a nitrogen-containing LPD FSG film; and d) Cu interconnects inlayed in said trenches; wherein said low-k dielectric layer 10 and said Cu interconnects are separated with said barrier dielectric liner 20, whose thin surface layer adjacent to the Cu interconnects has a nitrogen concentration within 3–50 atom % and a fluorine concentration within 0.5–10 atom %.

What is claimed is:

1. A semiconductor device having a structure of Cu interconnect/barrier dielectric liner/trenches of low-k dielectric comprising:

a) a substrate;

b) a dielectric layer on said substrate, wherein said dielectric layer has a delectric (k) value lower than 3.0 and said dielectric layer has a plurality of trenches;

c) a barrier dielectric liner on each sidewall of said plurality of trenches, wherein said barrier dielectric liner is a nitrogen-containing liquid-phase-deposition (LPD) fluorosilicate glass (FSG) film; and d) Cu interconnects inlayed in said trenches; wherein said low-k dielectric layer and said Cu interconnects are separated with said barrier dielectric liner, and a thin surface layer of said barrier dielectric liner adjacent to said Cu interconnect has a nitrogen concentration of 3–50 atom % and a fluorine concentration of 0.5–10 atom %.

2. The semiconductor device according to claim 1, wherein said dielectric layer is methyl silsesquioxane (MSQ), or hydrogen silsesquioxane (HSQ).

3. The semiconductor device according to claim 2, wherein said dielectric layer is methyl silsesquioxane (MSQ).

4. The semiconductor device according to claim 1, wherein said barrier dielectric liner has a fluorine concentration of 6–10 atom % in a bulk part outside said thin surface layer of said barrier dielectric liner.

5. The semiconductor device according to claim 1, wherein said thin surface layer of said barrier dielectric liner has a depth of 3–30 nm.

6. The semiconductor device according to claim 1, wherein said nitrogen-containing liquid-phase-deposition (LPD) fluorosilicate glass (FSG) film is prepared by immersing said substrate having said dielectric layer thereon with said plurality of trenches into a silica-supersaturated $H_2SiF_6$ solution to form a fluorosilicate glass film, and then by annealing the fluorosilicate glass film in $NH_3$-plasma ambient.

7. The semiconductor device according to claim 6, wherein said silica-supersaturated $H_2SiF_6$ solution is prepared by elevating a temperature of a silica-saturated $H_2SiF_6$ solution for 10° C. or above.

8. The semiconductor device according to claim 7, wherein said temperature of said silica-saturated $H_2SiF_6$ solution is about 0° C., and said elevated temperature of said silica-supersaturated $H_2SiF_6$ solution is about 25° C.

9. The semiconductor device according to claim 8, wherein said silica-saturated $H_2SiF_6$ solution is prepared by adding a sufficient amount of silica powder into a $H_2SiF_6$ solution having a concentration between 0.5–4.0 M, stirring the resulting mixture at 0° C. for a period of time, and then filtering the mixture for removal of undissolved silica powder.

10. The semiconductor device according to claim 6, wherein said annealing the fluorosilicate glass film in $NH_3$-plasma ambient is conducted in a plasma-enhanced chemical vapor deposition reactor under the following conditions: chuck temperature of 25–400° C., chamber pressure of 10–800 mTorr, RF power of 100–1000 W and $NH_3$ gas flow rate of 100–2000 sccm, and annealing time of 30–7200 sec.

11. A method for forming a structure of barrier dielectric liner/trenches of low-k dielectric on a semiconductor substrate comprising the following steps:

A) preparing a silica-supersaturated hydrofluosilicic acid ($H_2SiF_6$) solution;

B) immersing a semiconductor substrate having a plurality of low-k dielectric trenches into the silica-supersaturated $H_2SiF_6$ solution prepared in step A), so that a whole surface of said plurality of low-k dielectric trenches is capped with a fluorosilicate glass (FSG) film, wherein a space between vis-à-vis FSG-capped sidewalls of each trench is preserved for formation of a Cu interconnect;

C) removing the FSG film not on the vis-à-vis sidewalls of each trench by using anisotropic etching; and D) nitridation of the FSG film remaining on the vis-à-vis sidewalls of each trench from step C) by using $NH_3$-plasma annealing for enhancing the barrier property of FSG film to Cu penetration.

12. The method according to claim 11 further comprising E) forming a Cu interconnect in said space between the vis-à-vis FSG-capped sidewalls of each trench after step D).

13. The method according to claim 11, wherein said low-k dielectric trenches is made of methyl silsesquioxane (MSQ), or hydrogen silsesquioxane (HSQ).

14. The method according to claim 13, wherein said low-k dielectric trenches is made of methyl silsesquioxane (MSQ).

15. The method according to claim 11, wherein said silica-supersaturated $H_2SiF_6$ solution in step A) is prepared by elevating a temperature of a silica-saturated $H_2SiF_6$ solution for 10° C. or above.

16. The method according to claim 15, wherein said temperature of said silica-saturated $H_2SiF_6$ solution is about 0° C., and said elevated temperature of said silica-supersaturated $H_2SiF_6$ solution is about 25° C.

17. The method according to claim 16, wherein said silica-saturated $H_2SiF_6$ solution is prepared by adding a sufficient amount of silica powder into a $H_2SiF_6$ solution having a concentration between 0.5–4.0 M, stirring the resulting mixture at 0° C. for a period of time, and then filtering the mixture for removal of undissolved silica powder.

18. The method according to claim 11, wherein said FSG film formed in step B) has a dielectric constant (k) lower than 3.9.

19. The method according to claim 18, wherein said FSG film formed in step B) has a dielectric constant (k) lower than 3.5.

20. The method according to claim 11, wherein said FSG film formed in step B) has a fluorine concentration of 6–10 atom %.

21. The method according to claim 11, wherein said $NH_3$-plasma annealing is conducted in a plasma-enhanced chemical vapor deposition reactor under the following conditions: chuck temperature of 25–400° C., chamber pressure of 10–800 mTorr, RF power of 100–1000 W and $NH_3$ gas flow rate of 100–2000 sccm, and annealing time of 30–7200 sec.

22. The method according to claim 11, wherein said $NH_3$-plasma annealing in step D) forms a thin nitrogen-containing layer on a surface of the FSG film, wherein the thin nitrogen-containing layer has a nitrogen concentration of 3–50 atom %, and a fluorine concentration of 0.5–10 atom.

23. The method according to claim 22, wherein the thin nitrogen-containing layer has a depth of 3–30 nm.

* * * * *